United States Patent [19]

Hirayama

[11] Patent Number: 5,023,750
[45] Date of Patent: Jun. 11, 1991

[54] ELECTRONIC COMPONENT HAVING IMPROVED LOW RESISTANCE CONTACT AND MANUFACTURING METHOD THEREFOR

[75] Inventor: Makoto Hirayama, Hyogo, Japan

[73] Assignee: Mitsubishi Denki Kabushiki Kaisha, Tokyo, Japan

[21] Appl. No.: 482,583

[22] Filed: Feb. 21, 1990

[30] Foreign Application Priority Data

Feb. 23, 1989 [JP] Japan .................... 1-44301

[51] Int. Cl.$^5$ .................... H01G 4/06; H01G 7/00; H01L 27/02
[52] U.S. Cl. .................... 361/313; 29/25.42; 357/42; 357/51
[58] Field of Search .................... 361/311, 312, 313; 357/51, 42; 29/25.42; 156/643

[56] References Cited

U.S. PATENT DOCUMENTS

| 4,233,109 | 11/1980 | Nishizawa | 156/643 |
|---|---|---|---|
| 4,741,800 | 5/1988 | Yamazaki | 156/643 |
| 4,811,076 | 3/1989 | Tigelaar et al. | 357/51 |
| 4,859,623 | 8/1989 | Busta | 357/23.4 X |
| 4,862,231 | 8/1989 | Abend | 357/19 |
| 4,914,546 | 4/1990 | Alter | 361/313 |
| 4,937,645 | 6/1990 | Ootsuka et al. | 357/42 |

FOREIGN PATENT DOCUMENTS 59-215728 12/1984 Japan .

OTHER PUBLICATIONS

Y. Ohji et al., "Reliability of Nano-Meter Thick Multi-Layer Dielectric Films on Poly-Crystalline Silicon", IEEE/IRPS (1987), pp. 55-59.
Y. Ohno et al., "Reliability of Trench Capacitors with SiO$_2$/Si$_3$N$_4$ Double-Layer Films for High Density DRAM's", pp. 35-36.

Primary Examiner—Donald A. Griffin
Attorney, Agent, or Firm—Lowe, Price, Leblanc and Becker

[57] ABSTRACT

A capacitor includes a lower electrode formed from a layer of silicon or polycrystalline silicon, a single or multi-layer dielectric film such as a nitride film, and an upper electrode formed on the dielectric film. The dielectric film is formed, after a surface layer of the lower electrode has been removed by etching, on a new surface of the lower electrode continuously in a non-oxidizing atmosphere. By this process, formation of an incidental oxide film between the dielectric film and the lower electrode can be prevented.

In a direct contact region of the conductive layer, the surface of the contact region is also etched by dry chemical etching, and thereafter the conductive layer is formed in an oxygen-free atmosphere. By doing so, generation of an incidental oxide film having high resistance can be prevented, whereby the contact characteristic can be improved.

13 Claims, 12 Drawing Sheets

ELECTRONIC COMPONENT HAVING IMPROVED LOW RESISTANCE CONTACT AND MANUFACTURING METHOD THEREFOR

BACKGROUND OF THE INVENTION

1. Field of the Invention

This invention relates generally to an improved direct contact structure for semiconductor devices and to a method of manufacturing therefor. The invention further relates to an improved capacitor structure having an increased value of capacitance as a function of surface area. The invention has particular applicability to semiconductor memory devices.

2. Description of the Background Art

Capacitors are widely used as passive elements which constitute integrated circuits in conventional semiconductor devices. As an example of a semiconductor device having such a capacitor, a sectional structure of a memory cell of a DRAM (Dynamic Random Access Memory) is shown in FIG. 10F. A memory cell of a DRAM includes a MOS (Metal Oxide Semiconductor) transistor and a capacitor.

Referring to FIG. 10F, a pair of n-type diffused layers 2a and 2b (the source and the drain) are formed on a surface of a p-type silicon substrate 1. A gate oxide film 3 is formed on the p-type silicon substrate 1 between the n-type diffused layers 2a and 2b. A gate electrode 4 is formed on the gate oxide film 3. The n-type diffused layers 2a and 2b, gate oxide film 3 and gate electrode 4 generally constitute a MOS transistor.

A silicon nitride layer 5 is formed on the n-type diffused layer 2b. The silicon nitride layer 5 serves as a capacitor gate insulating film. A capacitor gate electrode 6 is formed on a surface of the silicon nitride film 5. The n-type diffused layer 2b, silicon nitride film 5 and capacitor gate electrode 6 cooperatively constitute a capacitor of a memory cell.

A bit line 7 extends through a contact hole and is connected to the n-type diffused layer 2a. An element isolating oxide film 8 isolates each adjacent memory cells from each other.

Subsequently, a storing operation of the memory cell will be described. Referring to FIG. 10F, a voltage higher than a predetermined level is applied to the gate electrode 4 of the MOS transistor of the memory cell shown. Consequently, an n-type inversion layer is formed in a channel region 9 between the n-type diffused layer 2a serving as the source electrode and the other n-type diffused layer 2b serving as the drain electrode. Thus, electric charge moves from the bit line 7 to the n-type diffused layer 2b by way of the n-type diffused layer 2a and the inversion layer formed in the position of the channel region 9. The electric charge is then accumulated in surface portions of the capacitor gate electrode 6, silicon nitride layer 5 and n-type diffused layer 2b which cooperatively form a capacitor. The accumulated electric charge serves as stored data of information.

A storage function of memory cells of a DRAM depends upon judgment of presence or absence of electric charge accumulated in a capacitor of each memory cell. Accordingly, each capacitor is required to have a sufficient electric charge accumulating capacity to permit judgment of presence or absence of accumulation of electric charge. The capacity of a capacitor has a proportional relationship to an area of a capacitor gate insulating film which opposes the capacitor gate electrodes but has an inverse proportional relationship to the thickness of the film. In semiconductor devices for which a high integration is required in recent years, reduction of the area which is occupied in a plane by capacitors cannot be avoided. As such reduction proceeds, it has been attempted to make capacitor gate insulating film (dielectric films) from thin films in order to assure the capacities of capacitors. Also in the memory cell capacitors of the DRAM described above, each dielectric film is made from a thin film, and a silicon nitride film having a high dielectric constant is employed, by which the capacities of the capacitors are assured.

Subsequently, a process of producing a memory cell of such described above will be described with reference to FIGS. 10A to 10F.

Figure 10A:
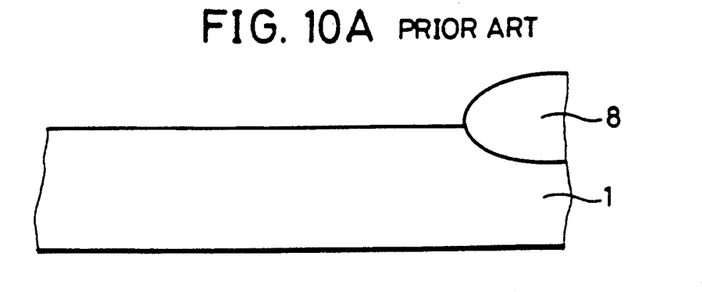
FIGS. 10A, 10B, 10C, 10D, 10E and 10F are schematic sectional views illustrating different successive steps of a conventional process of producing a memory cell of a DRAM having a planar type capacitor.

At first, an element insulating film 8 is selectively formed on a surface of a p-type silicon substrate 1 as shown in FIG. 10A using the LOCOS (Local Oxidation of Silicon)) method.

Figure 10B:
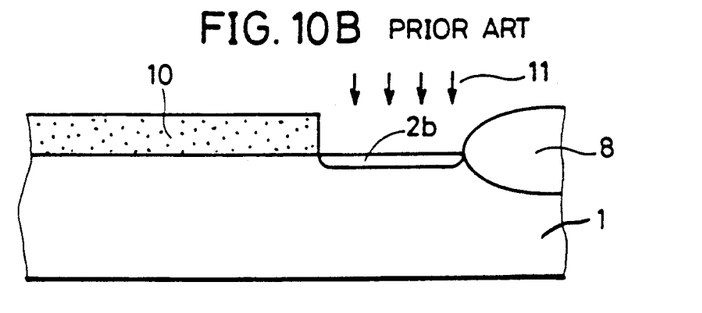

Then, n-type impurity ion 11 is implanted into surface portion of the p-type silicon substrate 1 using a mask of patterned resist 10 to form an n-type diffused layer 2b as shown in FIG. 10B.

Figure 10C:
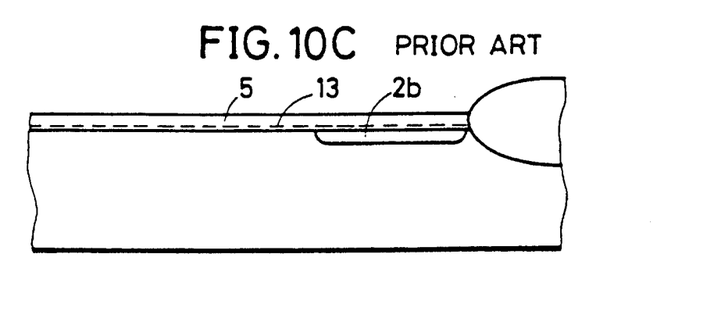

Subsequently, the resist 10 is removed, and a silicon nitride film 5 is deposited using the vacuum CVD (Chemical Vapor Deposition) method as shown in FIG. 10C.

An undesirable silicon oxide film 13 is formed on the main surface of the silicon substrate between the step of removing the resist and the step of forming a silicon nitride film 5. The undesirable silicon oxide film 13 causes problems as will be described later.

Figure 10D:
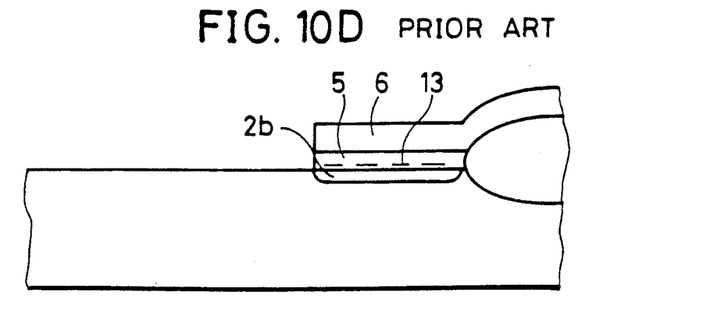

After that, polycrystalline silicon is deposited on a surface of the silicon nitride film 5, and the polycrystalline silicon film and the silicon nitride film 5 are patterned into a predetermined configuration as shown in FIG. 10D. By the step, a capacitor gate electrode 6 is formed.

Figure 10E:
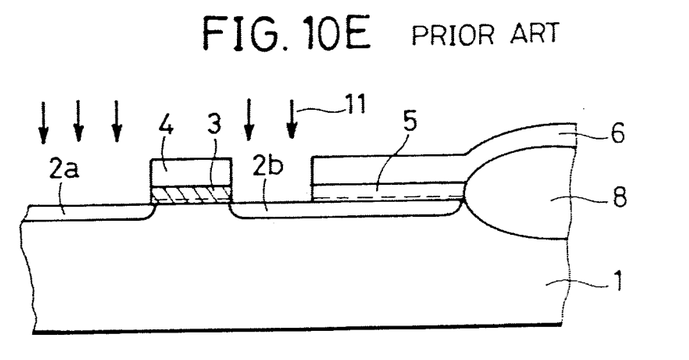
Figure 10F:
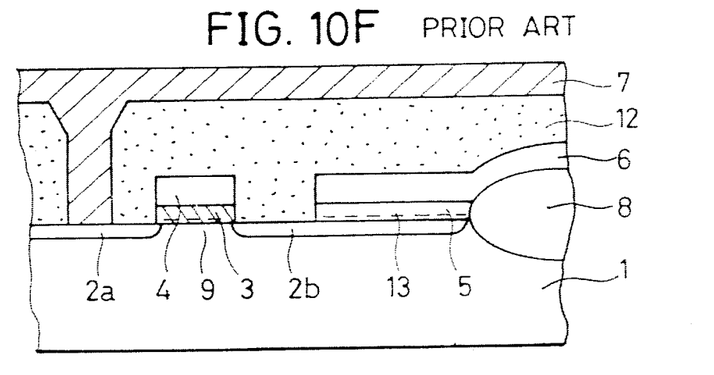

Then, a gate oxide film 3 is formed on the surface of the p-type silicon substrate 1 by the thermal oxidation method as shown in FIG. 10E. A polycrystalline silicon layer is formed on a surface of the gate oxide layer 3. Then, the polycrystalline silicon layer and the gate oxide layer 3 are patterned into predetermined configuration. Subsequently, n-type impurity ion 11 is implanted into a surface portion of the p-type silicon substrate 1 using a thus patterned gate electrode 4 as a mask. By the step, n-type diffused layers 2a and 2b are formed on the surface of the p-type silicon substrate 1.

After that, an interlayer insulating film 12 is formed on the surface of the p-type silicon substrate 1 on which the MOS transistor and the capacitor are formed in this manner, as shown in FIG. 10F. A bit line 7 is further formed on a surface of the interlayer insulating film 12. The bit line 7 extends through a contact hole formed in the interlayer insulating film 12 and is connected to the n-type diffused layer 2a.

With a DRAM produced by such a producing process as described above, it is a problem that a silicon oxide film 13 is formed between the silicon nitride film 5 and the surface of the p-type silicon substrate 4 of the capacitor.

The problem with regard to undesirable silicon oxide film 13 will be described in the following. It is to be noted that the terminology of undesirable silicon oxide film here is used as a general name including an ambient produced oxide film described below and a chamber produced oxide film.

Figure 14:
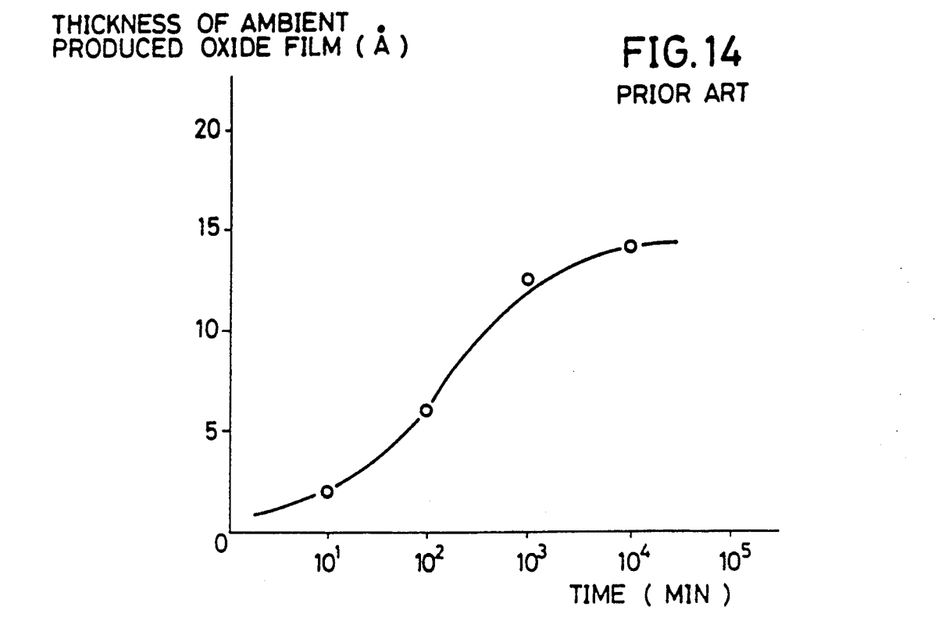
FIG. 14 is diagram illustrating a relationship between a natural oxide film formed on a surface of a silicon substrate and an interval of time for which the surface of the silicon substrate is exposed to the external air.

In the conventional producing process, the step of forming an n-type diffused layer 2b on a surface of a silicon substrate 1 (FIG. 10B) is performed using an ion implantation equipment or the like. The subsequent step of forming a silicon nitride film 5 on the surface of the silicon substrate 1 (FIG. 10C) is performed using a low pressure CVD equipment or the like. Between the two steps in the producing process, the silicon substrate 1 is transported between such two equipments. During such transportation, the silicon substrate 1 is exposed at the surface thereof to the external air. Consequently, an ambient produced oxide film is formed on the surface of the silicon substrate 1 by reaction with oxygen in the air. FIG. 14 illustrates a relationship between the thickness of such ambient produced oxide film and the interval of time over which the surface of the silicon substrate 1 is exposed to the external air. The ambient produced oxide film is formed in relatively short period to the thickness of about 10 Å, and thereafter, the speed of formation is reduced. Such ambient produced oxide film 13 is naturally formed normally with a thickness of 10 to 20 Å or so.

Figure 12:
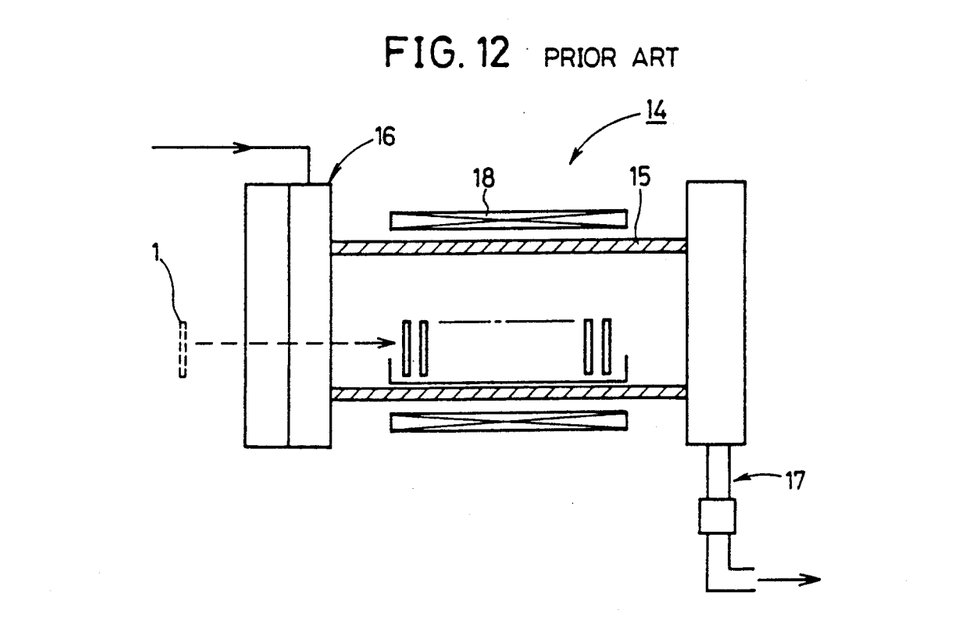
FIG. 12 is a schematic sectional view showing general structure of a conventional vacuum CVD equipment used for production of a DRAM.

Meanwhile, general structure of a low pressure CVD equipment is shown in FIG. 12. In the inside of such low pressure CVD equipment 14, a silicon nitride film 5 is formed on a surface of a p-type silicon substrate 1. The low pressure CVD equipment 14 includes a reactor tube 15, a reaction gas introducing section 16, and a vacuum discharging section 17. A heater 18 is provided on an outer periphery of the reactor tube 15.

The silicon substrate 1 is placed in the inside of the reactor tube 15, and formation of a film proceeds in the inside of the reactor tube 15. However, when the silicon substrate 1 is inserted into the inside of the reactor tube 15, the external air is admitted into the inside of the reactor tube 15. The thus admitted external air causes an oxide film to be formed on a surface of the silicon substrate 1 in the furnace heated to a temperature of 550° to 650° C. The oxide film is called contamination oxide film.

Figure 15:
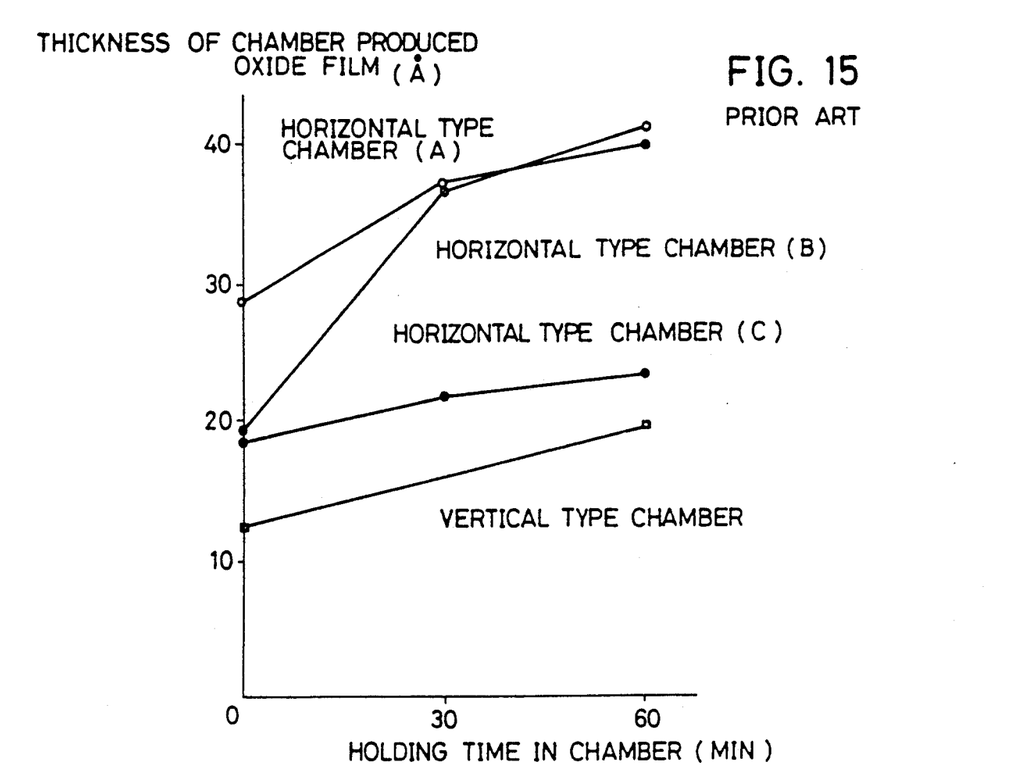
FIG. 15 is a diagram illustrating relationships between a thickness of a contamination oxide film formed, in a reacting step of a conventional thin film forming equipment, on a surface of a silicon substrate and an interval of time for which the silicon substrate is maintained in various types of diffusing furnaces.
Figure 16:
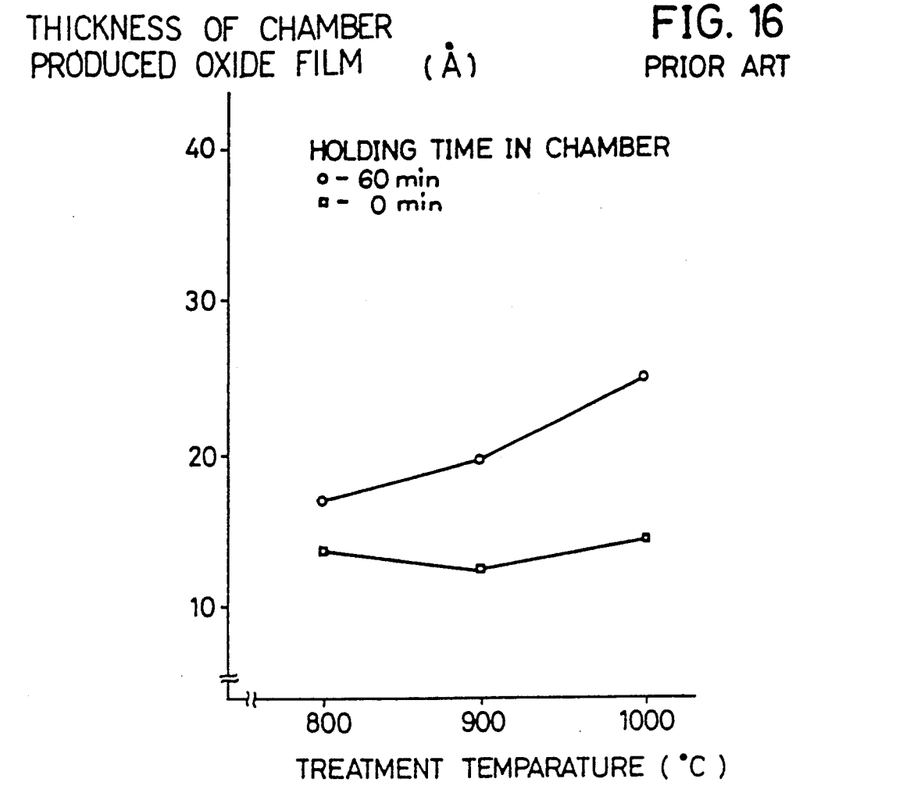
FIG. 16 is a diagram illustrating a relationship between a processing temperature of a conventional thin film forming equipment and thickness of a contamination oxide film formed on a surface of a silicon substrate.

FIGS. 15 and 16 illustrate the thickness of such contamination oxide film. In particular, FIG. 15 illustrates a relationship between the interval of time for which the silicon film is maintained in the reactor tube 15 and the thickness of the contamination oxide film thus formed, using various types of reactor furnace as a parameter. Meanwhile, FIG. 16 illustrates a relationship between the temperature at which the silicon film 1 is processed in the reactor furnace and the thickness of the contamination oxide film, using an interval of time for which the silicon film is maintained as a parameter.

Figure 11:
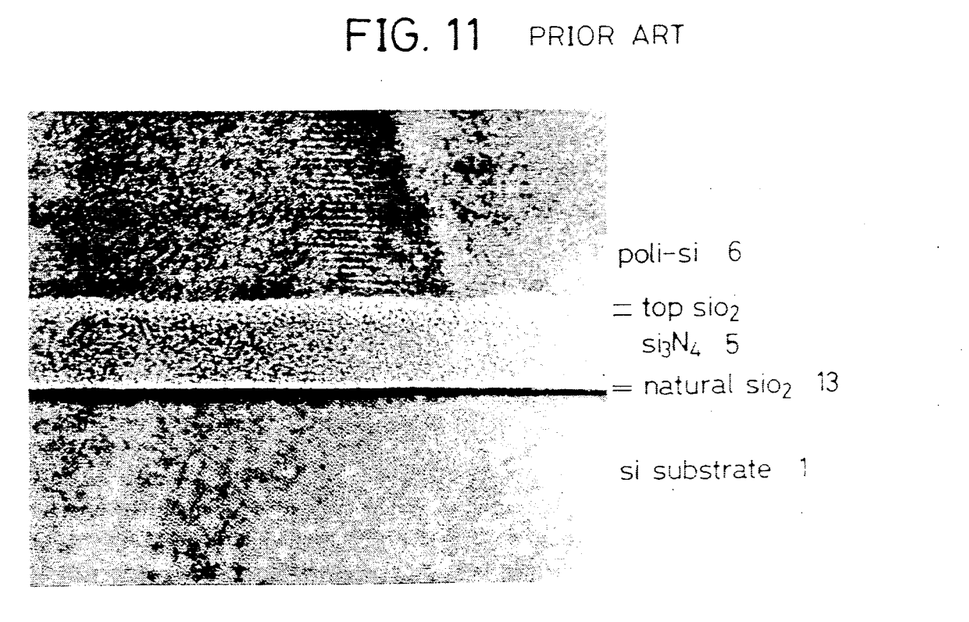
FIG. 11 is a microscope photograph by a transmission type electron microscope showing crystalline structure of a section of a planar type capacitor of a DRAM produced by the conventional producing process.
Figure 13:
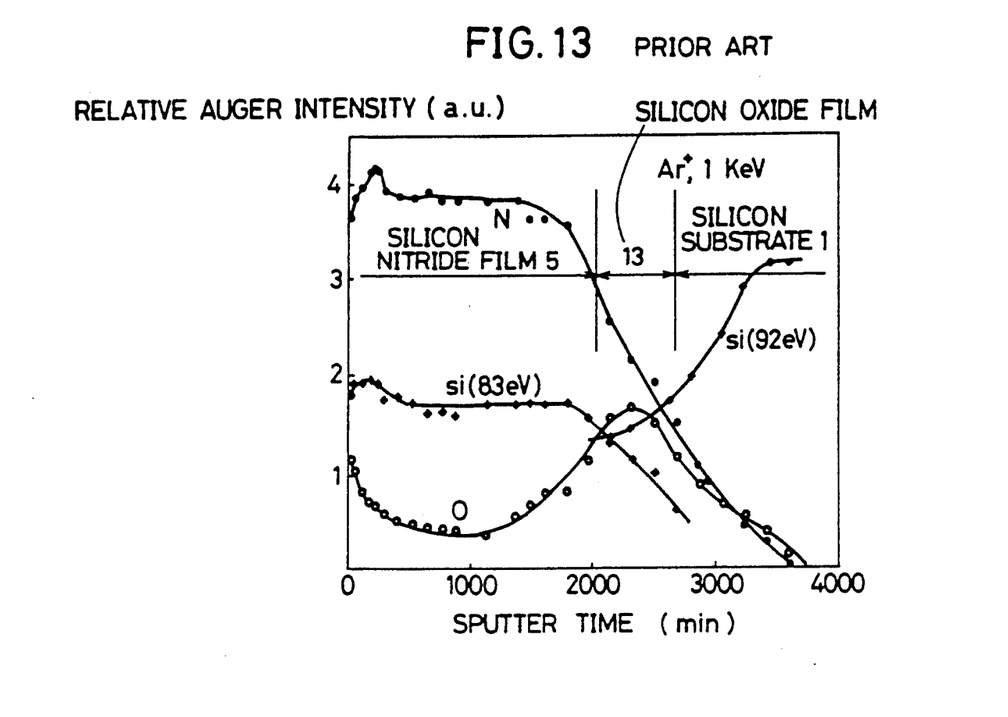
FIG. 13 is an atomic analytical view of a film of the planar type capacitor of the DRAM shown in FIG. 11.

In this manner, with the conventional process of producing memory cells of a DRAM, such silicon oxide film 13 is formed between the silicon nitride film 5 of the capacitor and the surface of the p-type silicon substrate 1. Consequently, the dielectric layer of the capacitor has a multi-layer film structure having the silicon oxide layer 13 and the silicon nitride film 5. FIG. 11 shows a transmission scanning electron microscope photograph of a section of an exemplary capacitor having a multi-layer film structure. Referring to FIG. 11, formation of the silicon oxide film 13 can be clearly seen. It is to be noted that the photograph exhibits a capacitor of a two-layer film structure, as a dielectric film, having a silicon nitride film ($Si_3N_4$) and a top silicon oxide film (top $SiO_2$) formed on the silicon nitride film. On the other hand, FIG. 13 shows an analytic view in the multi-layer film wherein the multi-layer film is analyzed by the Auger electron analysis which is a method of microanalysis. In FIG. 13, N denotes nitrogen, Si silicon and O oxygen. Then, as seen in FIG. 13, a silicon oxide film 13 (natural oxide film and contamination oxide film) exists between the silicon oxide film 5 and the silicon substrate 1.

Subsequently, description will be given of the fact that a capacitor of a multi-layer film structure having the silicon nitride film 5 and the silicon oxide film 13 has a smaller capacity than a capacitor which only has a silicon nitride film. It is assumed here that the ratio in dielectric constant between the silicon nitride film and the silicon oxide film is 2:1. In this instance, if the thickness of the silicon nitride film is 60 Å, then the film thickness corresponds to 30 Å where it is converted into a thickness of a silicon oxide film which has an equivalent capacity. However, in the case of the multi-layer film structure, if the thickness of the silicon nitride film is 60 Å and the thickness of the silicon oxide film 10 Å, the thickness of a silicon oxide film having an equivalent capacity is 40 Å. The electric charge accumulating capacity of a capacitor increases as the thickness of a dielectric layer decreases. Accordingly, the multi-layer film structure having a silicon nitride film and a silicon oxide film has a small electric charge accumulating capacity comparing with a capacitor of a single-layer film structure only having a silicon nitride film. Meanwhile, a natural oxide film or a contamination oxide film is not formed intentionally. Accordingly, the conventional process of production has a problem that a capacitor actually produced has a smaller capacity than an intended electric charge accumulating capacity.

Figure 17:
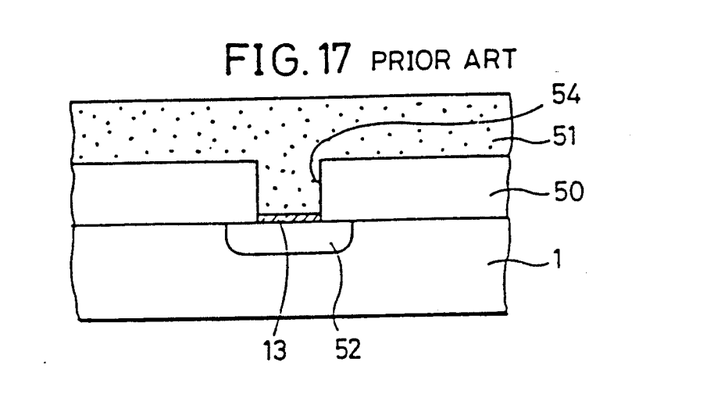
FIG. 17 is a cross sectional view of a direct contact structure of a conventional electronic component.

A problem derived from the formation of the undesirable silicon oxide film is generated also in connection with the direct contact structure between the silicon substrate and a conductive layer. FIG. 17 schematically shows the direct contact structure. The contact structure between the bit line 7 and the n type impurity region 2a shown in FIG. 10F corresponds to such a structure, for instance. Referring to FIG. 17, an impurity region 52 is formed on the main surface of the silicon substrate 1. A contact hole 53 reaching the impurity region 52 is formed in the insulating layer 50 formed on the main surface of the silicon substrate 1. A conductive layer 51 is connected to the impurity region 52 through the contact hole 54. A polycrystalline silicon layer doped with impurities, an Al layer, an Al alloy layer or the like is used as the conductive layer 51. The undesirable silicon oxide film 13 is incidentally formed between the surface of the impurity region 52 and the conductive layer 51. The undesirable silicon oxide film 13 is consisted of an ambient produced oxide film and a chamber produced oxide film, as in the above described example of the capacitor. If the conductive layer 51 is formed of an Al alloy or an alloy of metal having high melting point, the layer is formed by sputtering. Since the temperature for forming the film is low in sputtering, the surface of the substrate is not oxidized by the remaining oxide. Therefore, there is no chamber produced oxide film. If the conductive layer 51 is of polycrystalline silicon or a metal having high melting point which is formed by reduced pressure CVD method, the temperature of film formation is as high as 550° C. or more. Therefore, the surface of the substrate is oxidized by the remaining oxide. Consequently, a chamber produced oxide film having the thickness of about 20 to 30 Å is formed.

Since the undesirable silicon oxide film is of high resistance, it increases the contact resistance between the conductive layer 51 and the impurity region 2a.

The deterioration of the contact characteristics caused by a high resistance oxide film formed on the contact interface is common to a contact structure between a polycrystalline silicon interconnection layer and a layer of Al alloy or of a metal having high melting point, and to a contact structure between layers of Al alloy.

The following methods have been known for removing the undesirable silicon oxide film.

If the conductive layer 51 is formed of an Al alloy or an alloy of metal having high melting point which is formed by sputtering, the silicon substrate 1 on which the ambient oxide film 13 is generated is introduced in a sputtering apparatus, and the ambient oxide film 13 is removed by sputter etching. Thereafter, a film of Al alloy or metal having high melting point is formed by sputtering in the same apparatus.

If the conductive layer 51 is of polycrystalline silicon or metal having high melting point formed by reduced pressure CVD method, a polycrystalline silicon layer 51 is formed at first in a reduced pressure CVD apparatus. Thereafter, ion implantation is carried out on the undesirable silicon oxide film 13 consisted of the ambient produced oxide film and the chamber produced oxide film generated during formation of the polycrystalline silicon layer 51. The undesirable silicon oxide film is destroyed by the ion implantation, and the interface between the polycrystalline silicon layer 51 and the impurity region 52 is activated to reduce the resistance thereof.

If the conductive layer is of polycrystalline silicon, another method of removing is as follows. Namely, the temperature of a reaction furnace of the reduced pressure CVD apparatus is lowered to be not more than 400° C., and the silicon substrate 1 is introduced in the reaction furnace. By doing so, possible oxidation caused by the air unavoidably introduced to the reaction furnace is prevented. Thereafter, the chamber is evacuated, and the temperature is increased to a prescribed value to form the polycrystalline silicon layer 51. In accordance with this method, formation of the chamber produced oxide film can be prevented. However, the ambient produced oxide film is left as it is.

SUMMARY OF THE INVENTION

An object of the present invention is to increase the electric charge accumulating capacity of a capacitor.

Another object of the invention is to reduce the thickness of a dielectric layer of a capacitor.

A still further object of the invention is to provide a method of producing a capacitor which can prevent incidental formation of an oxide film on a dielectric layer of a capacitor.

A still further object of the present invention is to improve contact characteristic of a direct contact structure between conductors.

A still further object of the present invention is to provide a method of forming a direct contact structure with improved contact characteristic.

In accordance with a first aspect of the present invention, an electronic component comprises a first electrically conducting layer and a second layer formed on a surface of the first electrically conducting layer. The surface of the first electrically conducting layer is etched by dry chemical etching, so that an incidental oxide film is essentially removed. The second layer is formed in an oxygen-free atmosphere. Therefore, there is essentially no oxide film of high resistance between the first electrically conducting layer and a second layer. Therefore, if the second layer is a conducting layer, a contact resistance between the first electrically conducting layer and the second layer is reduced.

In accordance with another aspect of the present invention, a capacitor comprises a first electrode layer, a dielectric film formed on a surface of the first electrode layer, and a second electrode layer formed on the dielectric film. An incidental oxide film on the surface of the first electrode layer is removed by dry chemical etching. The dielectric film is formed with the first electrode layer maintained in an oxygen-free atmosphere. Consequently, the dielectric film can be made thin, whereby the capacitance of the capacitor can be increased.

The above and other objects, features and advantages of the present invention will become apparent from the following description and the appended claims taken in conjunction with the accompanying drawings.

DESCRIPTION OF THE PREFERRED EMBODIMENTS

Figure 1A:
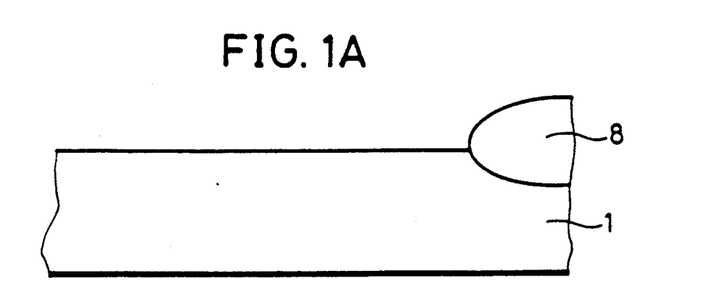
FIGS. 1A, 1B, 1C, 1D, 1E and 1F are schematic sectional views illustrating different successive steps of a process of producing a memory cell of a DRAM having a planar-type capacitor according to a first preferred embodiment of the present invention.
Figure 1B:
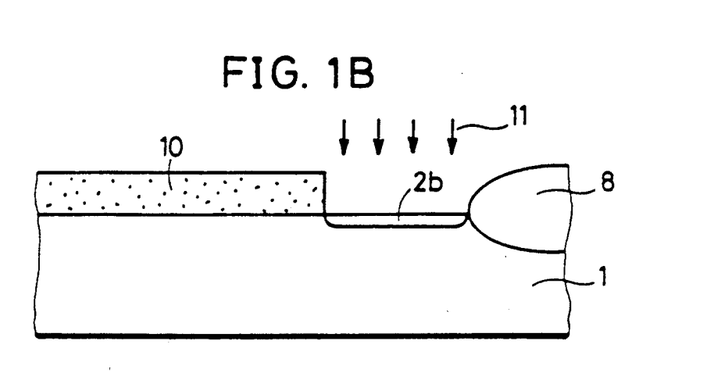
Figure 1C:
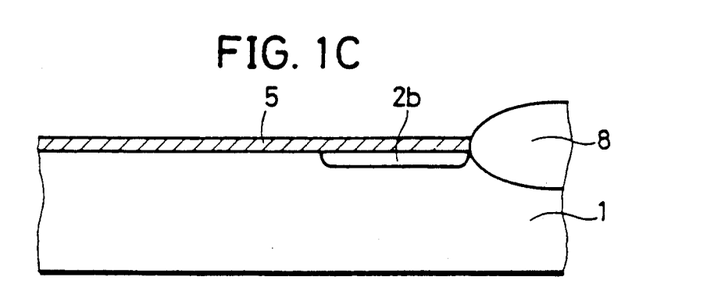
Figure 1D:
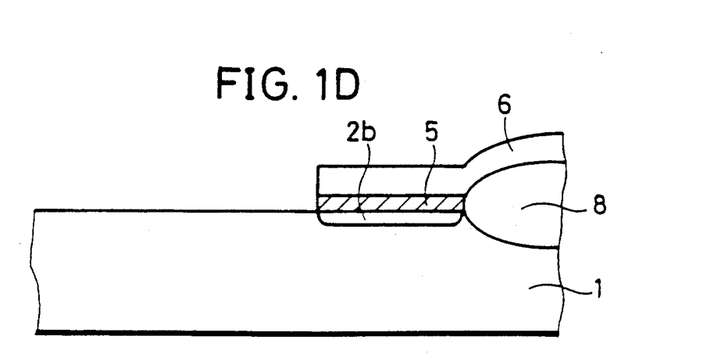
Figure 1E:
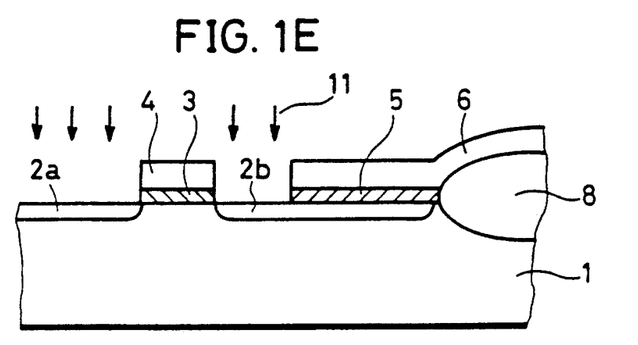
Figure 1F:
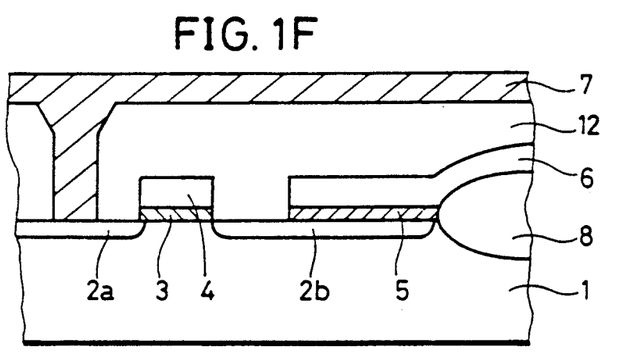
Figure 2:
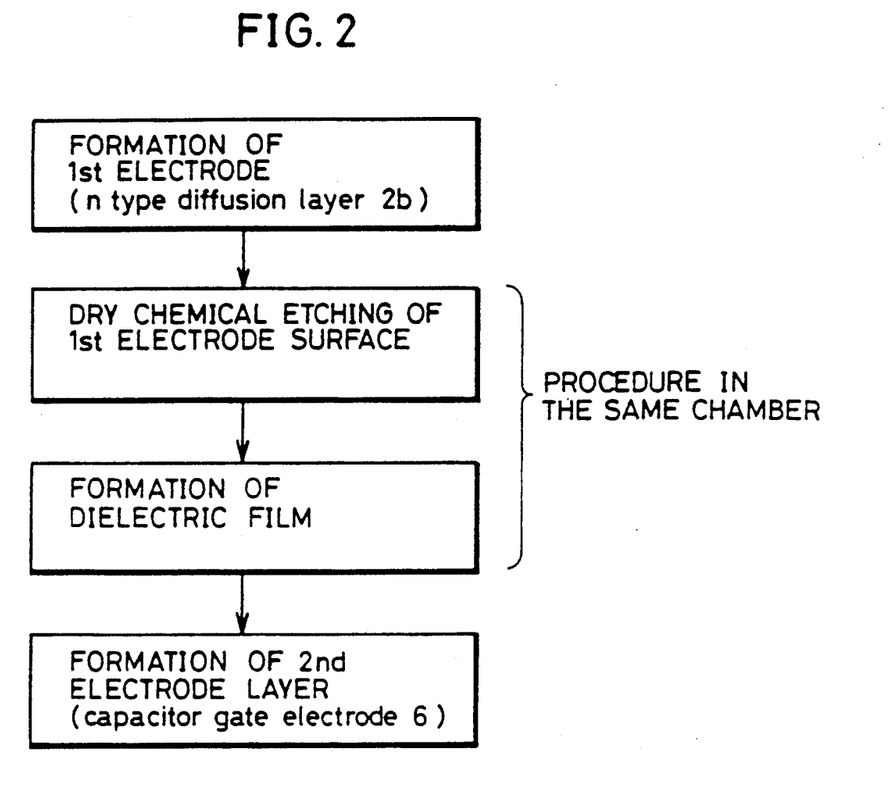
FIG. 2 is a schematic flow chart showing a manufacturing steps of FIGS. 1A to 1F.

As a most preferable embodiment of the present invention, a process of producing a memory cell of a DRAM having a so-called planar type capacitor is illustrated in FIGS. 1A to 1F. It is to be noted that the producing process is generally similar to the conventional producing process described hereinabove with reference to FIGS. 10A to 10F, and accordingly, overlapping description thereof is omitted herein to avoid redundancy. A schematic flow chart of the manufacturing steps is shown in FIG. 2. The characteristic of the producing process of the present invention resides in steps shown in FIGS. 1B and 1C. In particular, the producing process formation of an undesirable silicon oxide film between a n-type diffused layer $2b$ in a p-type silicon substrate 1 which forms a first electrode of a capacitor a silicon nitride film 5 which forms a dielectric film.

Figure 3:
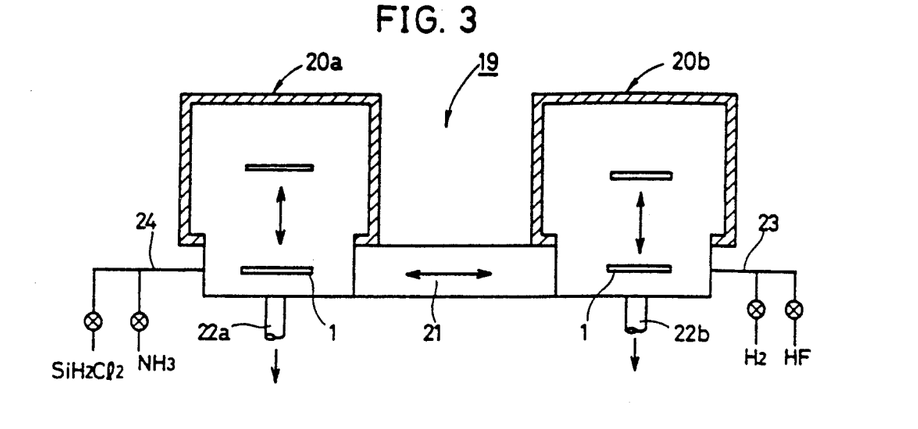
FIG. 3 is a schematic view showing general structure of an improved vacuum CVD equipment for removal of a silicon oxide film (natural oxide film) and formation of a silicon nitride film which is used in the process of producing a DRAM according to the present invention.

At first, a first method of preventing formation of an undesirable silicon oxide film will be described with reference to FIG. 3. The first method involves removal of a natural oxide film (ambient produced oxide film) and so forth formed on a surface of a silicon substrate 1 using a technique of vapor phase etching. FIG. 3 shows general structure of an improved low pressure CVD equipment. The improved low pressure CVD equipment generally denoted at 19 includes a pair of reactor furnaces $20a$ and $20b$. A loading/unloading rocking chamber 21 is formed between the first and second reactor furnaces $20a$ and $20b$. A pair of vacuum discharging sections $22a$ and $22b$ are provided for the reactor furnaces $20a$ and $20b$, respectively. Using the low pressure CVD equipment 19, a silicon substrate 1 (wafer) on which a n-type diffused layer $2b$ is formed is inserted into the inside of the second reactor furnace $20b$ of the low pressure CVD equipment 19. Then, the air in the inside of the second reactor furnace $20b$ is discharged outside by way of the vacuum discharging section $22b$ to make a vacuum condition. Subsequently, vapor of hydrogen fluoride (HF) is introduced into the second reactor furnace $20b$ from a gas introducing pipe 23 connected to the furnace $20b$. Consequently, an ambient produced oxide film which has been possibly formed on a surface of the silicon substrate 1 is removed by etching. After then, the silicon substrate 1 is moved into the first reactor furnace $21a$ by way of the loading/unloading rocking chamber 21. In this instance, the inside of the first reactor furnace $20a$ is set to a non-oxidizing atmosphere. After then, reaction gas ($SiH_2Cl_2$, $NH_3$) is introduced into the first reactor furnace $20a$ by way of a gas introducing pipe 24. Consequently, a silicon nitride film 5 is deposited on the surface of the p-type silicon substrate 1. With the method, all of the steps from removal of the ambient produced oxide film on the surface of the silicon substrate 1 to formation of the thin film 5 are performed in the same equipment. Accordingly, formation of a new ambient produced oxide film or a chamber produced oxide film can be prevented.

Figure 4:
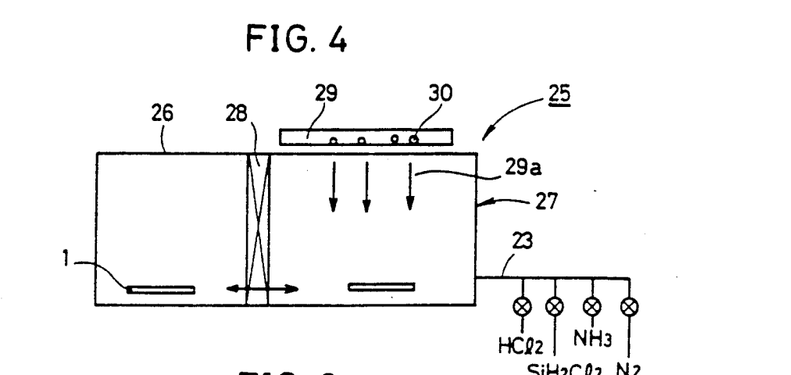
FIG. 4 is a schematic view showing general structure of a thin film forming equipment having an optically excitable etching function which is used for the step of removal of a silicon oxide film and formation of a silicon nitride film similar to that of FIG. 3.

Subsequently, a second method will be described with reference to FIG. 4. The second method employs a technique of etching by optically excited hydrogen chloride gas. The equipment shown in FIG. 3 is used for the method. The thin film forming equipment 25 which employs the optically excited etching method includes a wafer introducing chamber 26, a reactor chamber 27, and a loading/unloading rocking chamber 28. A gas introducing pipe 23 is connected to the reactor chamber 27. The gas introducing pipe 23 is further connected to gas supplying sections for HCl, $SiH_2Cl_2$, $NH_3$ and $N_2$. An ultraviolet ray irradiating source 29 and a heating device 30 are disposed on the outside of the reactor chamber 27.

A silicon substrate 1 is placed in the wafer introducing chamber 26. The silicon substrate 1 is then moved into the inside of the reactor chamber 27 by way of the loading/unloading rocking chamber 28. The inside of the reactor chamber 27 is set to a non-oxidizing atmosphere in advance. Then, HCl gas is filled into the inside of the reactor chamber 27. Further, ultraviolet rays $29a$ are irradiated upon a surface of the silicon substrate 1 from the ultraviolet ray irradiating source 29. The HCl gas in the reactor chamber 27 is excited by the ultraviolet rays $29a$ to dissociate molecules, and the thus produced active atoms and molecules act upon an ambient produced oxide film on the surface of the silicon substrate 1 to remove the ambient produced oxide film. After then, the inside of the reactor chamber 27 is set to a reaction gas ($SiH_2$, $Cl_2$, $NH_3$) atmosphere, and the surface of the silicon substrate 1 is heated from the heating source 30. Consequently, a silicon nitride film 5 is formed on the surface of the silicon substrate 1 from which the ambient produced oxide film has been removed.

Also with this method, the silicon nitride film 5 can be formed on the surface of the silicon substrate 1 without producing an ambient produced oxide layer or a chamber produced oxide film.

Figure 5:
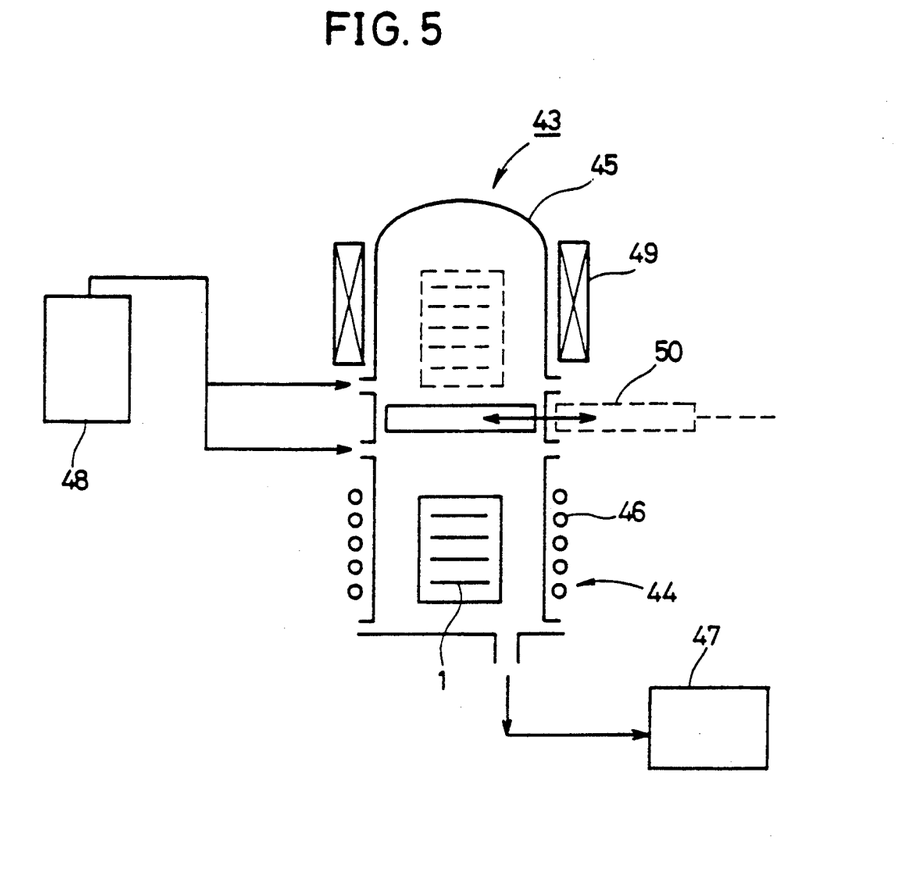
FIG. 5 is a schematic view showing general structure of a thin film forming equipment having a plasma generating equipment, which is used for the step of removal of a silicon oxide film and formation of a silicon nitride film.

A third method will be described with reference to FIG. 5. The third method employs low pressure plasma as a method of removing the ambient produced oxide film on the surface of the silicon substrate 1. The equipment shown in FIG. 5 is used for this method. The thin film forming equipment 43 employed in the third method comprises a plasma etching chamber 44 and a CVD reaction chamber 45. The plasma etching chamber 44 has a high frequency coil 46 on the outer periphery thereof for generating plasma. A vacuum evacuation system 47 and a reaction gas supplying system 48 are connected to the plasma etching chamber. The CVD reaction chamber 45 has a resistance heater 49 out of a reaction vessel. In addition, the reaction gas supplying system 48 is connected to the CVD reaction chamber 45. A gate valve 50 for opening/closing between the CVD reaction chamber 45 and the plasma etching chamber 44 is provided between the two chambers.

In the third method employing this apparatus, first the silicon substrate 1 is introduced in the plasma etching chamber 44. Mixture gas including hydrogen and carbon tetrafluoride is introduced as a plasma generation gas from the reaction gas supplying system 48. The plasma is generated by the high frequency coil 46, so that the ambient produced oxide film on the surface of the silicon substrate 1 is removed by plasma etching. Thereafter, the silicon substrate 1 is moved into the CVD reaction chamber 45 through the gate valve 50. A silicon nitride film 5 is formed on the surface of the silicon substrate 1 in the CVD reaction chamber.

These three methods are generally called dry chemical etching method. These methods enable continuous processing in the same apparatus when a polycrystalline silicon layer is formed by reduced pressure CVD method, as described in the foregoing. Formation of the polycrystalline silicon layer or a layer of metal having high melting point by reduced pressure CVD method provides superior coverage even at portion such as contact holes having large aspect ratio (depth/aperture diameter), compared with the sputtering method, for instance.

Figure 6:
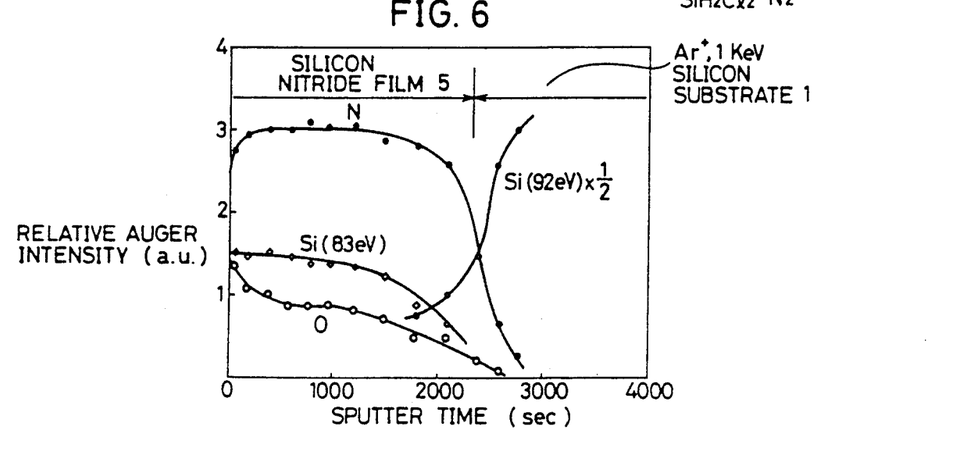
FIG. 6 is an atomic analytical view showing components of a film of a capacitor produced by the process of producing a DRAM according to the present invention.

The dielectric film of the capacitor which is formed using any of such producing processes as described above is composed only of a silicon nitride film 5. This can be seen from the atomic analytical view of FIG. 6 which shows of an atomic analysis of the dielectric film by the Auger electron analysis. In particular, referring to FIG. 6, the distribution of atoms of oxygen (O) is reduced in the neighborhood of the boundary between a region of the silicon substrate 1. This indicates that no silicon oxide film exists on the interface between the two regions. By preventing the presence of a silicon oxide film between the silicon substrate 1 and the dielectric film (silicon nitride film) 5 in this manner, the capacity of the capacitor has a high dielectric constant of the dielectric film and has a good leak current characteristic. Further, reduction in thickness of a dielectric film can be promoted This is because conventionally the influence of an undesirable oxide film has relatively increased in proportion to reduction in thickness of a dielectric film to hinder an increase of the capacity of a capacitor.

It is to be noted that, where the producing process of the present invention is adopted, the thickness of a silicon oxide film such as ambient produced oxide film is ideally zero. Actually, however, it is supposed that there still remains a very thin silicon oxide film. Further, the accuracy in detection of a silicon oxide film by a film thickness detector is 5 Å or so at the highest. Accordingly, the intention of the definition in the appended claims that the thickness of a silicon oxide film is less than 5 Å is that the thickness is less than 5 Å including zero.

Figure 7:
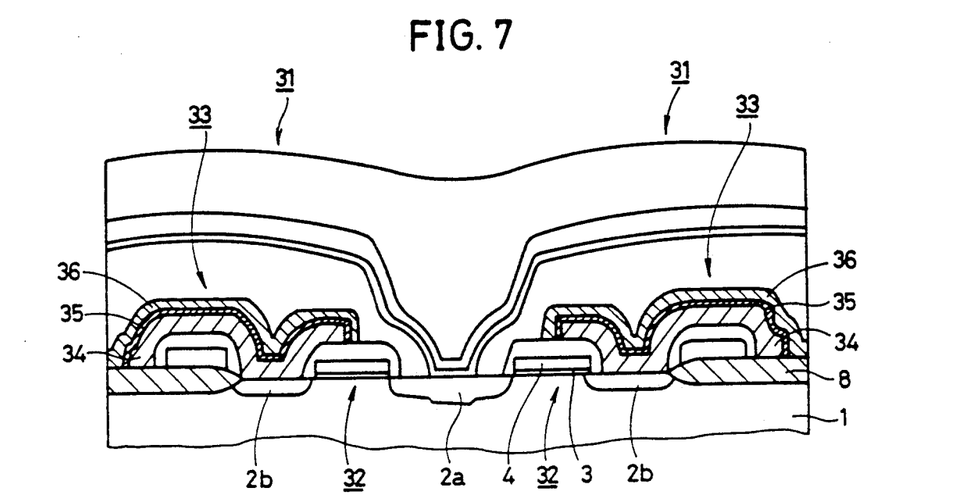
FIG. 7 is a sectional view showing structure of a memory cell of a DRAM having a stacked capacitor according to a second preferred embodiment of the present invention.

In the following, another preferable embodiment of the present invention will be described with reference to FIG. 7 which shows sectional structure of a DRAM having a so-called stacked capacitor. A memory cell 31 of the DRAM shown is composed of a MOS transistor 32 and a capacitor 33. The MOS transistor 32 is composed of a pair of n-type diffused layers 2a and 2b formed in a p-type silicon substrate 1, and a gate oxide film 3 and a gate electrode 4 formed on a surface of the p-type silicon substrate 1. The capacitor 33 is composed of a lower electrode layer (storage node) 34 made of polycrystalline silicon, a dielectric film 35 layered on the lower electrode layer 34 and formed from a silicon nitride film, and an upper electrode (cell plate) 36 layered on the dielectric film 35.

The present invention is applied to a process of forming the dielectric film 35 on the lower electrode 34 of the capacitor 33 of the DRAM and also to a structure of the same. In particular, if an ambient produced oxide layer (silicon oxide layer) should be produced on a surface of the lower electrode 34 made of polycrystalline silicon, then the capacity of the capacitor will be lowered as in the case of the conventional capacitor described hereinabove. Accordingly, the capacity of the capacitor 33 can be increased by removing the presence of such ambient produced oxide layer and so forth.

Figure 8:
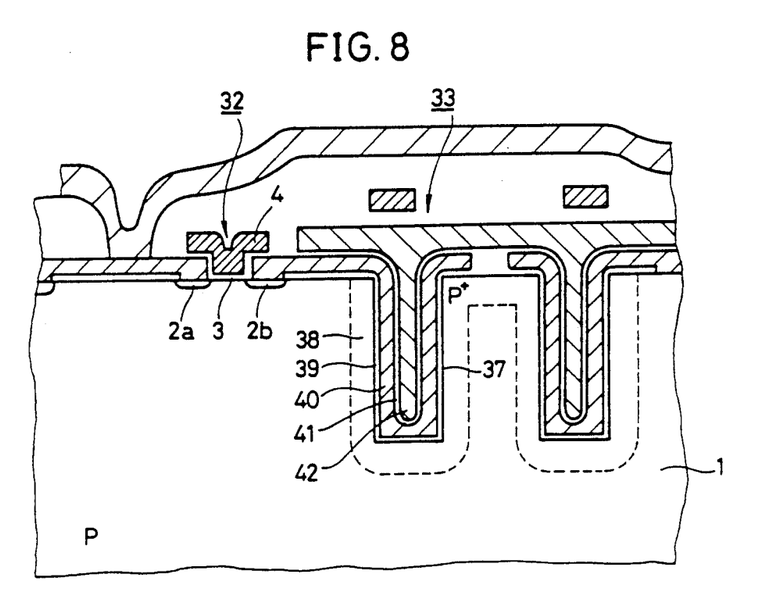
FIG. 8 is a similar sectional view but showing structure of a memory cell of a DRAM having a trench type capacitor according to a third preferred embodiment of the present invention.

A still further preferable embodiment of the present invention will be described subsequently. FIG. 8 schematically shows sectional structure of a DRAM having a so-called trench type capacitor. A memory cell of the DRAM having a trench type capacitor includes a MOS transistor 32 and a capacitor 33. The MOS transistor 32 is composed of a pair of n-type diffused layers 2a and 2b formed in a p-type silicon substrate 1, and a gate oxide film 3 and a gate electrode 4 formed on a surface of the p-type silicon substrate 1. The capacitor 33 is formed in a channel section 37 formed in the silicon substrate 1. A high concentration $p^+$ diffused layer 38 is formed in a sidewall of the channel section 37. A first dielectric film 39 formed from a silicon nitride film or the like is formed on an inner wall face of the channel section 37 and the surface of the p-type silicon substrate 1. A first electrode 40 is formed on a surface of the first dielectric film 39. A second dielectric film 41 is formed on a surface of the first electrode 40. A second electrode 42 is formed on a surface of the second dielectric film 41.

The process of producing a capacitor and the structure of such capacitor according to the present invention can be applied also to a memory cell of such a DRAM as described above. In particular, it is possible to prevent production of an ambient produced oxide film on the first dielectric film 39 formed on the surface of the p-type silicon substrate 1 and the inner surface of the channel section 37 and also on the second dielectric film 41 formed on the surface of the first electrode 40. Consequently, the electric charge accumulating capacitor of the trench-type capacitor can be increased.

In the embodiment of the DRAM having the stacked capacitor and the trench capacitor described above, polysilicon was used for the electrode layer of the capacitor. However, the present invention is not limited thereto. For example, the present invention may be applied to a capacitor having an electrode layer of the capacitor formed of a metal having high melting point such as W, Mo, or silicide of metal having high melting point such as W, Mo and having the dielectric film formed of $TiO_2$ (titanium dioxide), $Ta_2, O_5$ (tantalum oxide), a metal oxide film or a ferroelectric film such as PZT.

Now, an embodiment of the present invention applied to a direct contact structure of a semiconductor device will be described in the following.

Figure 9A:
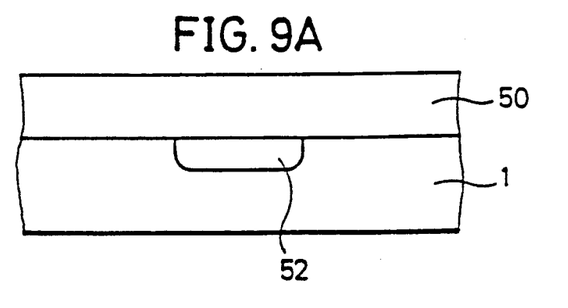
FIGS. 9A, 9B, 9C and 9D are schematic sectional views illustrating different successive steps of a direct contact structure of the present invention.

As shown in FIG. 9A, an insulating layer 50 is formed on a surface of a silicon substrate 1 on which an impurity region 52 has been formed.

Figure 9B:
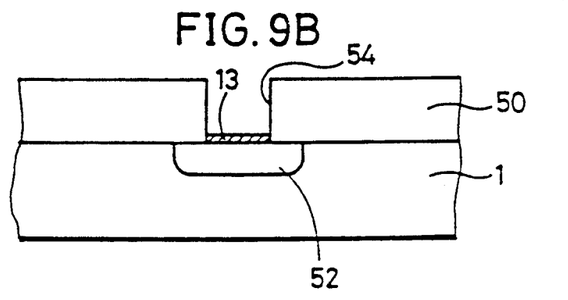

As shown in FIG. 9B, a contact hole 54 deep enough to reach the impurity region 52 is formed in the insulating layer 50 by photolithography and etching. By this step, the main surface of the silicon substrate 1 is exposed in the contact hole 54. Thereafter, the silicon substrate 1 is taken out from the etching apparatus to the outer atmosphere. An ambient produced oxide film 13 is formed on the surface of the silicon substrate 1 exposed in the contact hole 54, and exposed to the oxide in the atmosphere.

Figure 9C:
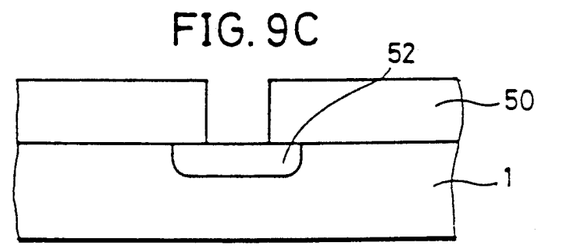

Thereafter, as shown in FIG. 9C, the undesirable oxide film is removed by vapor phase etching, etching using optically excited chlorine gas or plasma etching used in the above embodiment of a capacitor.

Figure 9D:
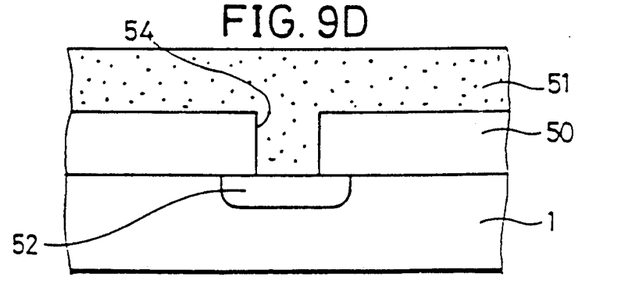

Thereafter, as shown in FIG. 9D, a conductive layer 51 is formed on the surface of the insulating layer 50 and in the contact hole 54 following the preceding step in an oxygen-free atmosphere, and thus a direct contact structure of a conductive layer 51 and an impurity region 52 is completed.

Having now fully described the invention, it will be apparent to one of ordinary skill in the art that many changes and modifications can be made thereto without departing from the spirit and scope of the invention as set forth herein.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of making a capacitor structure having improved capacitance having a lower electrode, a dielectric layer and an upper electrode, comprising the steps of:
   forming a first electrically conductive layer as the lower electrode;
   removing, by dry chemical etching in a substantially oxygen free atmosphere, an oxide film incidentally formed on the surface of the lower electrode so that the thickness of the incidental oxide film becomes less than 5 angstroms;
   forming a second layer of dielectric material, in a substantially oxygen free atmosphere, as said dielectric layer, and
   forming a third conductive layer as said upper electrode.

2. A method of making a capacitor according to claim 1, wherein said step of removing comprises vapor phase etching.

3. A method of making a capacitor according to claim 1, wherein said step of removing comprises optically excited chloride gas etching.

4. A method of making a capacitor according to claim 1, wherein said step of removing comprises plasma etching.

5. An improved capacitor structure comprising:
   a lower electrode formed of electrically conductive material,
   an incidental oxide film having a thickness of less than five angstroms formed on the surface of said lower electrode, and
   a layer of dielectric material formed on said incidental oxide film, and
   an upper electrode of electrically conductive material formed on said dielectric layer.

6. A capacitor of claim 5, wherein
   said first electrode has an exposed surfaced formed by etching said surface in an oxygen-free atmosphere.

7. The capacitor of claim 6, wherein said dielectric film is applied to said exposed surface of said lower electrode in an oxygen-free atmosphere.

8. The capacitor of claim 7, wherein said surface of said first electrode to be exposed is etched by dry chemical etching.

9. The capacitor of claim 7, wherein said dielectric layer is applied to the exposed surface of said first electrode by a CVD process.

10. The capacitor of claim 5, wherein
    said dielectric film is formed of one selected from the group consists of silicon nitride, titanium dioxide, hafnium oxide, metal oxide of a high melting point and composite films thereof.

11. The capacitor of claim 5, wherein
    said first electrode comprises an impurity region formed on a major surface of a semiconductor substrate.

12. The capacitor of claim 5, wherein
    said lower electrode comprises a polycrystalline silicon layer formed on a major surface of a semiconductor substrate.

13. The capacitor of claim 5, wherein
    said capacitor is formed on a semiconductor substrate having a trench on a main surface, and
    said lower electrode is of a polycrystalline silicon layer formed on an inner surface of said trench.

* * * * *